United States Patent
Hsiung

(10) Patent No.: US 8,437,184 B1
(45) Date of Patent: May 7, 2013

(54) METHOD OF CONTROLLING A VERTICAL DUAL-GATE DYNAMIC RANDOM ACCESS MEMORY

(75) Inventor: Chih-Wei Hsiung, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 16 days.

(21) Appl. No.: 13/312,074

(22) Filed: Dec. 6, 2011

(51) Int. Cl.
*G11C 11/34* (2006.01)

(52) U.S. Cl.
USPC ............ 365/185.02; 365/185.18; 365/185.26; 365/206

(58) Field of Classification Search ............. 365/185.02, 365/185.18, 185.26, 206
See application file for complete search history.

(56) References Cited

U.S. PATENT DOCUMENTS

| | | | | |
|---|---|---|---|---|
| 5,382,816 | A * | 1/1995 | Mitsui | 257/266 |
| 6,674,134 | B2 * | 1/2004 | Berry et al. | 257/397 |
| 6,874,760 | B2 * | 4/2005 | Steckel | 251/342 |
| 6,939,763 | B2 * | 9/2005 | Schlosser et al. | 438/253 |
| 7,247,570 | B2 * | 7/2007 | Thomas | 438/700 |
| 7,285,812 | B2 * | 10/2007 | Tang et al. | 257/296 |
| 7,326,611 | B2 | 2/2008 | Forbes | |
| 7,372,092 | B2 * | 5/2008 | Manning et al. | 257/296 |
| 7,378,702 | B2 * | 5/2008 | Lee | 257/296 |
| 7,564,084 | B2 * | 7/2009 | Song et al. | 257/296 |
| 7,981,736 | B2 * | 7/2011 | Juengling | 438/157 |
| 8,144,514 | B2 * | 3/2012 | Lee | 365/185.08 |
| 8,274,106 | B2 * | 9/2012 | Abbott et al. | 257/302 |
| 2005/0190617 | A1 | 9/2005 | Forbes et al. | |
| 2009/0256187 | A1 | 10/2009 | Kim | |

* cited by examiner

*Primary Examiner* — Viet Q Nguyen
(74) *Attorney, Agent, or Firm* — Muncy, Gleissler, Olds & Lowe, PLLC

(57) ABSTRACT

A method of controlling a vertical dual-gate DRAM provides a short circuit state, a clearing state and a false broken circuit state. In the short circuit state, a first gate and a second gate at two sides of a first pillar are controlled to respectively have a turn-on voltage to form electric connection between a drain and a source at two ends of the first pillar. In the clearing state, the first gate and second gate are controlled to respectively have a clearing voltage to disconnect electric connection between the drain and source at two ends of the first pillar. The false broken circuit state is entered after the clearing state has been finished. The invention does not separate gates between neighboring pillars, but controls ON/OFF of transistors electrically so that no current leakage is generated in the clearing state and problem of inaccurate data reading can be prevented.

12 Claims, 9 Drawing Sheets

US 8,437,184 B1

METHOD OF CONTROLLING A VERTICAL DUAL-GATE DYNAMIC RANDOM ACCESS MEMORY

FIELD OF THE INVENTION

The present invention relates to a dynamic random access memory (DRAM) and particularly to a method of controlling a vertical dual-gate DRAM.

BACKGROUND OF THE INVENTION

Constant advances of semiconductor manufacturing technology have greatly shrunken the size of electronic elements and also greatly reduced their production costs. Conventional semiconductor manufacturing techniques generally adopt etching, ion implantation or wiring on substrates to form planar semiconductor structures. These techniques now can fabricate a chip at a minimum size of 6F2. However, as development speed of minimizing feature size has gradually slowed down, the occupied area of semiconductor on wafers is difficult to shrink. As a result, development of vertical (also called three-dimensional) semiconductor manufacturing technology has progressed rapidly. It aims to grow semiconductors vertically on the wafer to reduce the occupied area of transistors on the wafer surface and can further shrink the chip dimension to 4F2. For instance, U.S. Pat. No. 7,326,611 entitled "DRAM arrays, vertical transistor structures and methods of forming transistor structure and DRAM Arrays" and U.S. publication No. 2005/0190617 entitled "Folded bit line DRAM with vertical ultra thin body transistors" disclose a vertical pillar transistor structure, manufacturing method and processes. It has a pillar and a gate material at one side to control ON/OFF of the pillar functioned as a transistor. The gate material usually is a metal wire formed by etching to attach to two sides of the pillar without connecting to each other. With the present technique capable of reducing the feature size to 40 nm, etching metal wires on two sides of the pillar to form the gate material encounters a great challenge due to controlling thickness is difficult.

U.S. publication No. 2009/0256187 entitled "SEMICONDUCTOR DEVICE HAVING VERTICAL PILLAR TRANSISTORS AND METHOD FOR MANUFACTURING THE SAME" discloses a technique that forms a gate only at one side of the pillar. It etches the pillar to form a trench and disposes metal in the trench to form a gate. It provides a fabrication method different from the previous techniques by doing away etching of the metal wires to avoid the problem of thickness control of the metal wires. But forming the gate still needs the etching process, and forming the trench on the pillar by etching also has the same kind of difficulty.

SUMMARY OF THE INVENTION

The primary object of the present invention is to solve the problems of fabricating gates in transistors difficult in the procedure of manufacturing at a smaller feature size.

To achieve the foregoing object, the present invention provides a method of controlling a vertical dual-gate DRAM. The memory includes a bit line located on the surface of a substrate, a plurality of pillars located on the bit line and spaced from each other, a plurality of trenches each of which being formed between any two of the pillars, a dielectric layer formed on the surface of the trench, and a plurality of gates located in the trenches and spaced from the pillars by the dielectric layer. The pillars have a first pillar and a second pillar. The method includes:

providing a short circuit state to control a first gate and a second gate which are located at two sides of the first pillar to respectively have a turn-on voltage to form electric connection between a drain and a source at two ends of the first pillar;

providing a clearing state to control the first gate and second gate to respectively have a clearing voltage to disconnect the electric connection between the drain and source at two ends of the first pillar, the clearing voltage being smaller than the turn-on voltage; and providing a false broken circuit state to control the second gate and a third gate which are located at two sides of the second pillar to respectively have a turn-on voltage while the first gate is controlled to have a cut-off voltage so that a false broken circuit is formed between the drain and source at two ends of the first pillar, and electric connection is formed between a source and a drain at two ends of the second pillar.

By means of the technique set forth above, electric connection between the source and drain at two ends of the pillar is controlled via two gates at two sides of the pillar. Hence no cutting and separation is needed for the gates in the trenches. Therefore, etching process can be exempt from the procedure of manufacturing at a smaller feature size, thus the problem of difficult to separate the gates can be solved. The problem of difficult fabrication process for gate separation can be overcome. In addition, the two gates can be controlled to have the clearing voltage in the clearing state to avert the problem of current leakage when the short circuit state is transited to the false broken circuit state to improve data reading accuracy.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
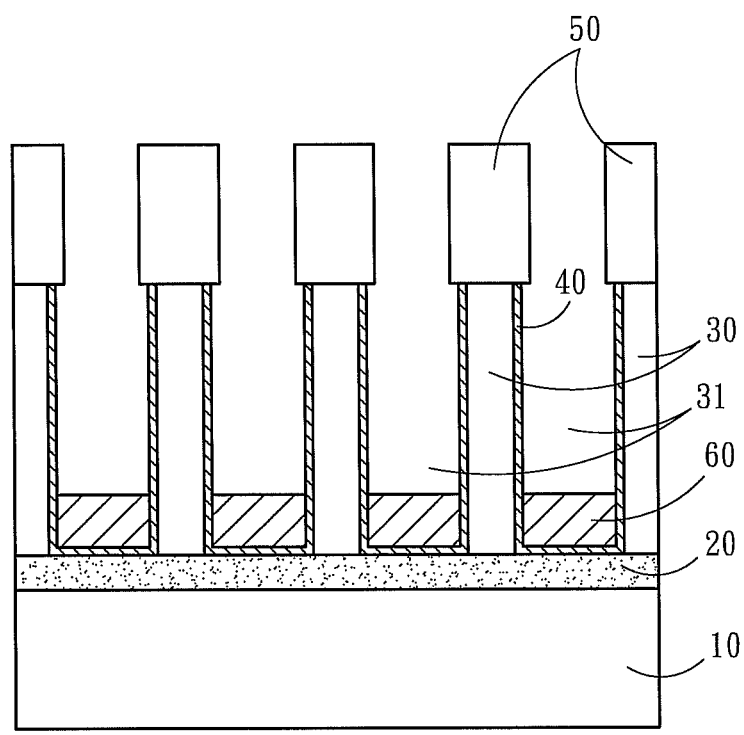
FIG. 1 is a sectional view of an embodiment of the invention.
Figure 2A:
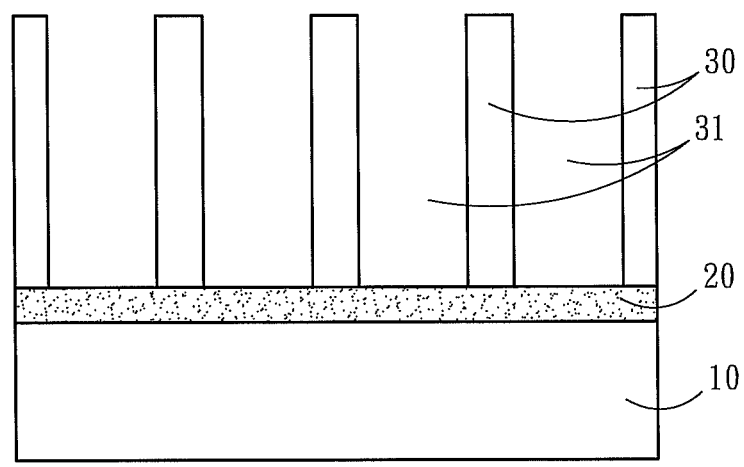
FIGS. 2A through 2D are schematic views of an embodiment of the manufacturing process according to the invention.
Figure 2B:
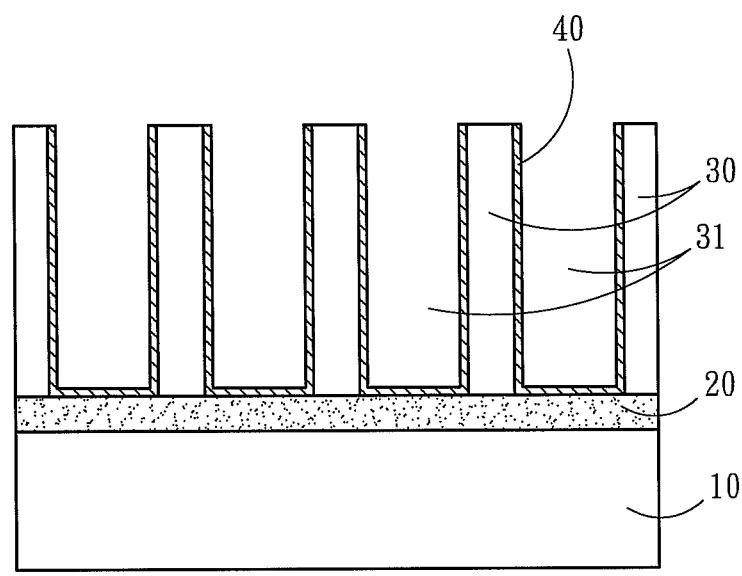
Figure 2C:
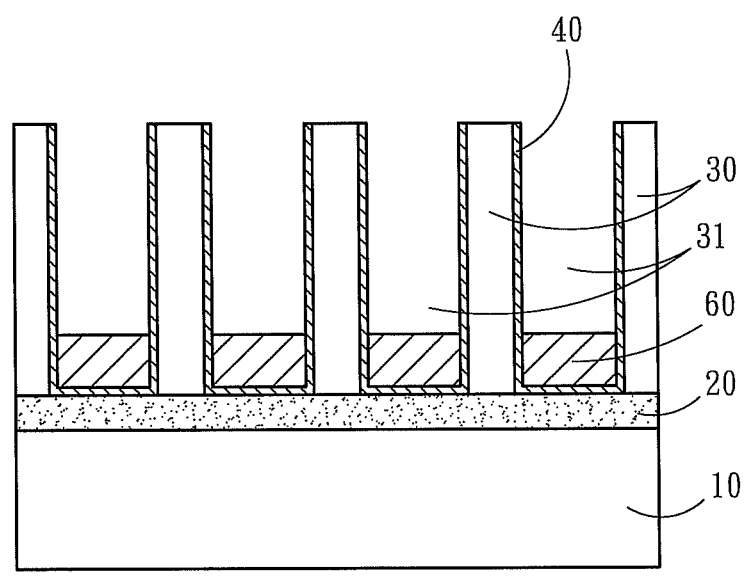
Figure 2D:
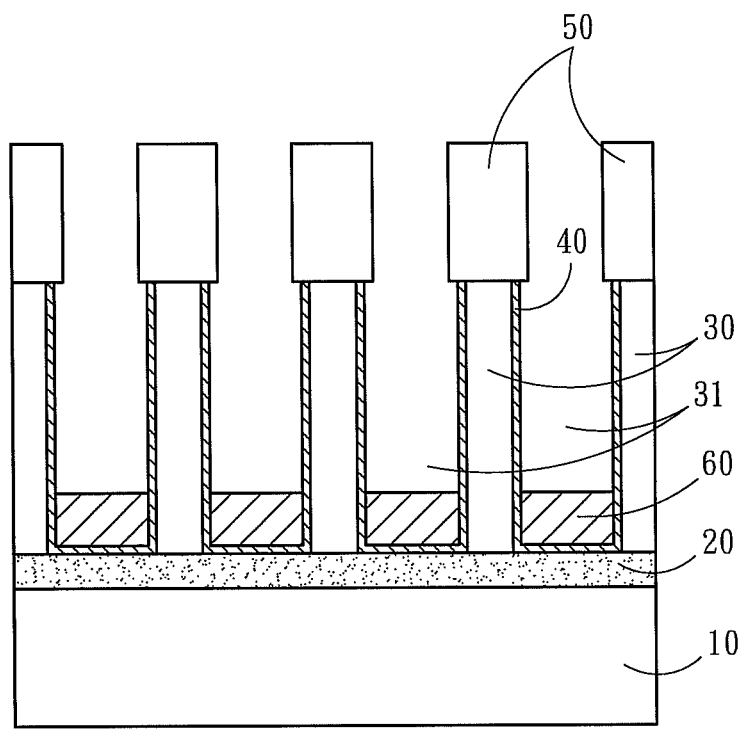

Please refer to FIG. 1, the present invention aims to provide a method of controlling a vertical dual-gate DRAM. The memory includes a bit line 20 formed on the surface of a substrate 10, a plurality of pillars 30 located on the bit line 20 and spaced from each other, a plurality of trenches 31 each of which being formed between any two of the pillars 30, a dielectric layer 40 formed on the surface of the trench 30, and a plurality of gates 60 located in the trenches 31 and spaced from the pillars 30 by the dielectric layer 40. The substrate 10 and pillars 30 can be made from silicon or germanium. Each pillar 30 has two ends doped with doping elements to form a source or a drain. The doping elements can be elements selected from 2A, 3A, 5A or 6A group to become P-type or N-type transistors. The source and drain can be formed and positioned in many ways, but form no part of the invention, thus details are omitted herein. The dielectric layer 40 can be made from silicon oxide, silica, silicon nitride or other materials of high dielectric coefficient. The gate 60 in this invention means a corresponding pillar 30 functioned as a transistor. The gate 60 aims to control electric connecting conditions of the pillar 30. The gate 60 is located in the trench 31 and perpendicular to the bit line 20 to form a checkerboard array, thus can function as a word line of the memory.

Please refer to FIGS. 2A through 2D for the method of manufacturing the DRAM of the invention. First, the pillars 30 are formed on the bit line 20 of the substrate 10 that are spaced from each other to form the trenches 31. The bit line 20 can be formed on the surface of the substrate 10 by burying a metal wire or via ion diffusion. Next, referring to FIG. 2B, the dielectric layer 40 is formed on the surface of the trench 31; then, referring to FIG. 2C, the gates 60 are located in the trenches 31; and finally, referring to FIG. 2D, a capacitor 50 is formed at one end of each pillar 30 remote from the substrate 10. The capacitor 50 shown in FIG. 2D merely serves for illustrative purpose and does not means being directly mounted onto the pillar 30. It is also to be noted that the gates 60 held in the trenches 31 are not separated by etching, but are spaced from two neighboring pillars 30 through the dielectric layer 40. Through a method depicted below, ON/OFF of the transistors can be accomplished.

Figure 3A:
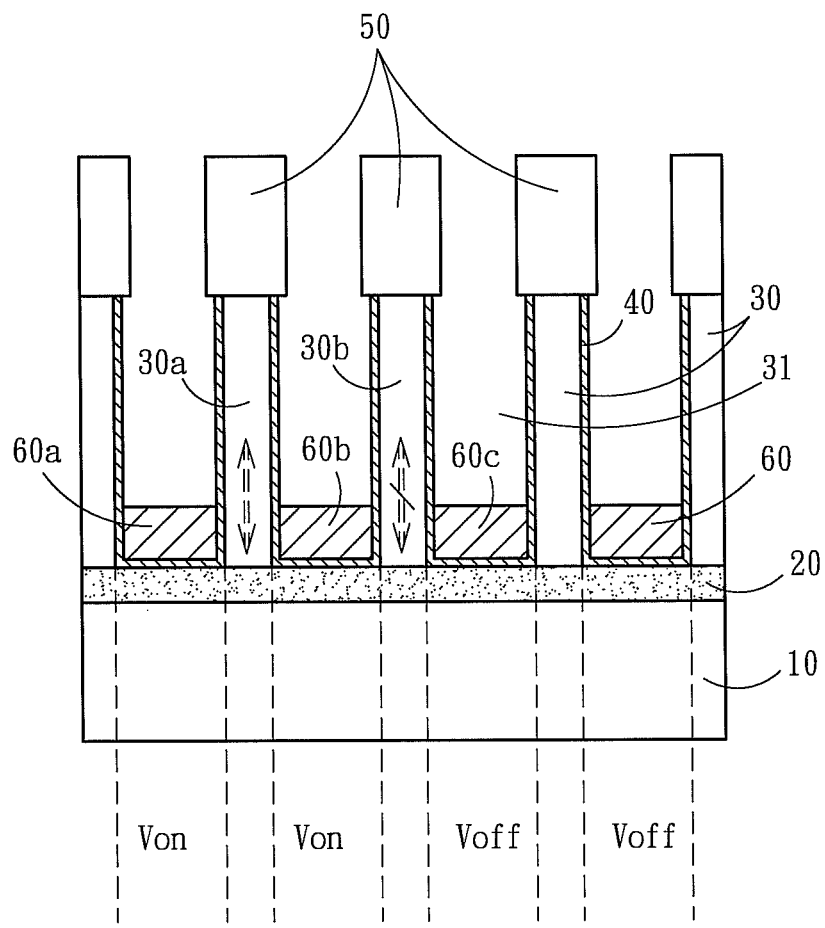
FIG. 3A is a schematic view of an embodiment of the invention in operation condition-1.
Figure 3B:
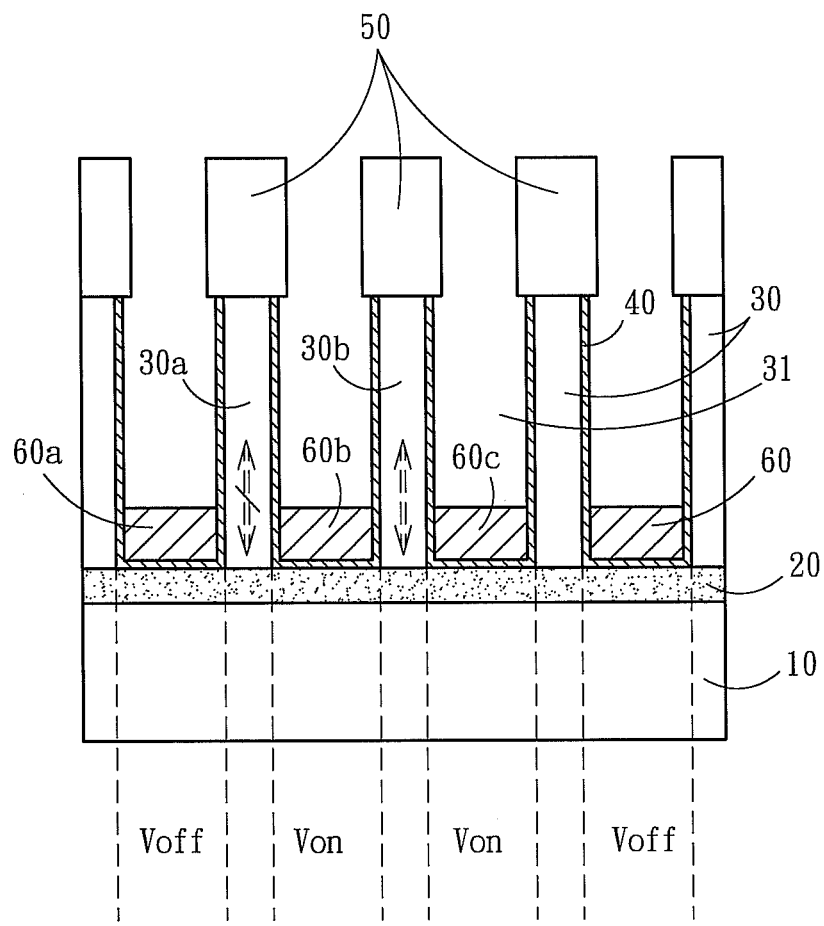
FIG. 3B is a schematic view of an embodiment of the invention in operation condition-2.
Figure 3C:
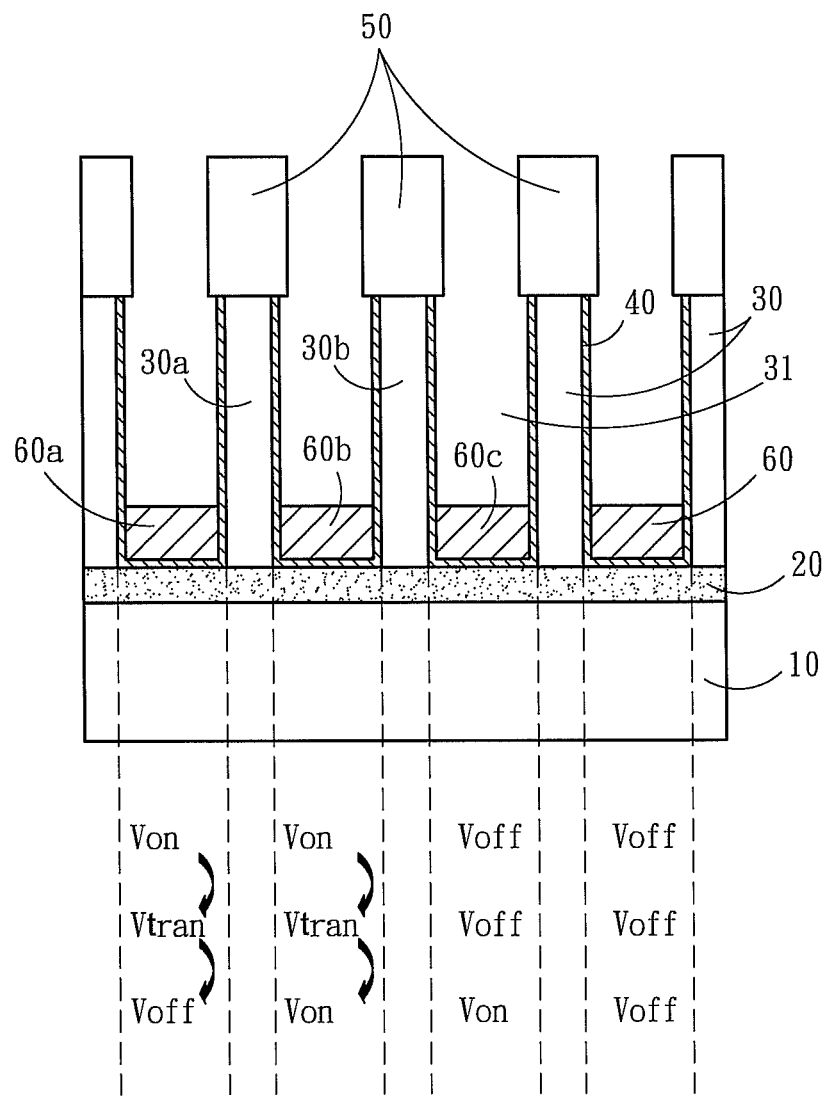
FIG. 3C is a schematic view of an embodiment of the invention in operation condition-3.

Referring to FIGS. 3A through 3C, among the pillars 30, a first pillar 30a and a second pillar 30b are defined for two neighboring ones. To facilitate discussion, the gates 60 at two sides of the first pillar 30a are defined respectively as a first gate 60a and a second gate 60b while the gates 60 at two sides of the second pillar 30b are defined respectively as the second gate 60b and a third gate 60c. The second gate 60b is adjacent to the first pillar 30a and second pillar 30b; i.e., the second gate 60b is interposed between the first pillar 30a and second pillar 30b.

The method of the invention is implemented as follows:

When the first pillar 30a is in a short circuit state, the first gate 60a and second gate 60b are controlled to respectively a turn-on voltage Von as shown in FIG. 3A, so that the drain and source at two ends of the first pillar 30a form electric connection and charge access can be performed via the capacitor 50 connecting to the first pillar 30a. In this embodiment, the first pillar 30a and second pillar 30b are N-type transistors with two ends doped with N-type ions. Hence the turn-on voltage Von is a positive voltage. Because the drain and source at two ends of the first pillar 30a are electrically connected, the bit line 20 can save or retrieve charges from the capacitor 50 connected to the first pillar 30a via the first pillar 30a.

Access of DRAM is consecutive reading or writing one after another. When the first pillar 30a has finished signal reading or writing, the second pillar 30b proceeds with reading or writing as shown in FIG. 3B. The second gate 60b and third gate 60c respectively have the turn-on voltage Von so that the source and drain at two ends of the second pillar 30b form electric connection, and the first gate 60a is transited to a cut-off voltage Voff so that the first pillar 30a enters to a false broken circuit state. It is to be noted that the false broken circuit state mentioned herein means that the gates 60 at two sides of the pillar 30 has a turn-on voltage Von at one side and a cut-off voltage Voff at another side. In this embodiment, the cut-off voltage Voff is an opposite value to the turn-on voltage Von, hence the source and drain at two ends of the pillar 30 does not form electric connection. However, the cut-off voltage Voff is not limited to the opposite value to the turn-on voltage Von, merely one of two sides of the pillar 30 having the cut-off voltage Voff to disconnect the source with the drain at two ends of the pillar 30 can achieve the same effect. In this embodiment, at the moment that the first pillar 30a is transited from the short circuit state to the false broken circuit state, the first pillar 30a is still in a weak conductive condition due to transition delay of the first gate 60a to generate current leakage problem.

Referring to FIG. 3C, to overcome the aforesaid problem, the invention provides a clearing state during the aforesaid state transition process. During the state transition process, the first gate 60a and second gate 60b are controlled to respectively to have a clearing voltage Vtran so that the drain and source at two ends of the first pillar 30a do not form electric connection. The clearing voltage Vtran is smaller than the turn-on voltage Von, hence the clearing voltage Vtran is equivalent to the cut-off voltage Voff to allow the first pillar 30a to enter a full broken circuit state; next, the second gate 60b is regulated to the turn-on voltage Von to allow the first pillar 30a to enter the false broken circuit state to prevent current leakage from affecting signal access during state transition. Moreover, the clearing voltage Vtran may also be an average value of the turn-on voltage Von and cut-off voltage Voff to prevent electric connection from occurring between the source and drain at two ends of the first pillar 30a. Thereafter, the first gate 60a is regulated to the cut-off voltage Voff and the second gate 60b is regulated to the turn-on voltage Von to allow the first pillar 30a to enter the false broken circuit state. Thereby, when the second gate 60b transits from the clearing voltage Vtran to the turn-on voltage Von, there is no need to regulate the cut-off voltage Voff to the turn-on voltage Von, merely transiting from the average value of the cut-off voltage Voff and turn-on voltage Von to the turn-on voltage Von is needed. Reaction speed also is faster.

For instance, +2V for the turn-on voltage Von, −2V for the cut-off voltage Voff, and 0V for the clearing voltage Vtran are given. When the first pillar 30a is in the short circuit state, both the first gate 60a and second gate 60b are +2V; next, entering to the clearing state, the first gate 60a and second gate 60b are regulated to 0V to prevent electric connection between the source and drain at two ends of the first pillar 30a, and also prevent current leakage from occurring. Then the first gate 60a is regulated to −2V and the second gate 60b is regulated to +2V to enter the false broken circuit state so that no electric connection is formed between the source and drain at two ends of the first pillar 30a. Finally, when the second pillar 30b has finished signal access, the second gate 60b also is regulated to −2V, namely the first gate 60a and second gate 60b both have the cut-off voltage Voff to enter the full broken circuit state.

Aside from designing the first pillar 30a and second pillar 30b to be N-type transistors as previously discussed, they also can be designed as P-type transistors. In such a condition, the turn-on voltage Von is a negative voltage while the cut-off voltage Voff is a positive voltage, and they are opposite numbers, namely their absolute value is the same. The clearing voltage Vtran can be the same as the cut-off voltage Voff, or the average value of the turn-on voltage Von and cut-off voltage Voff.

Figure 4:
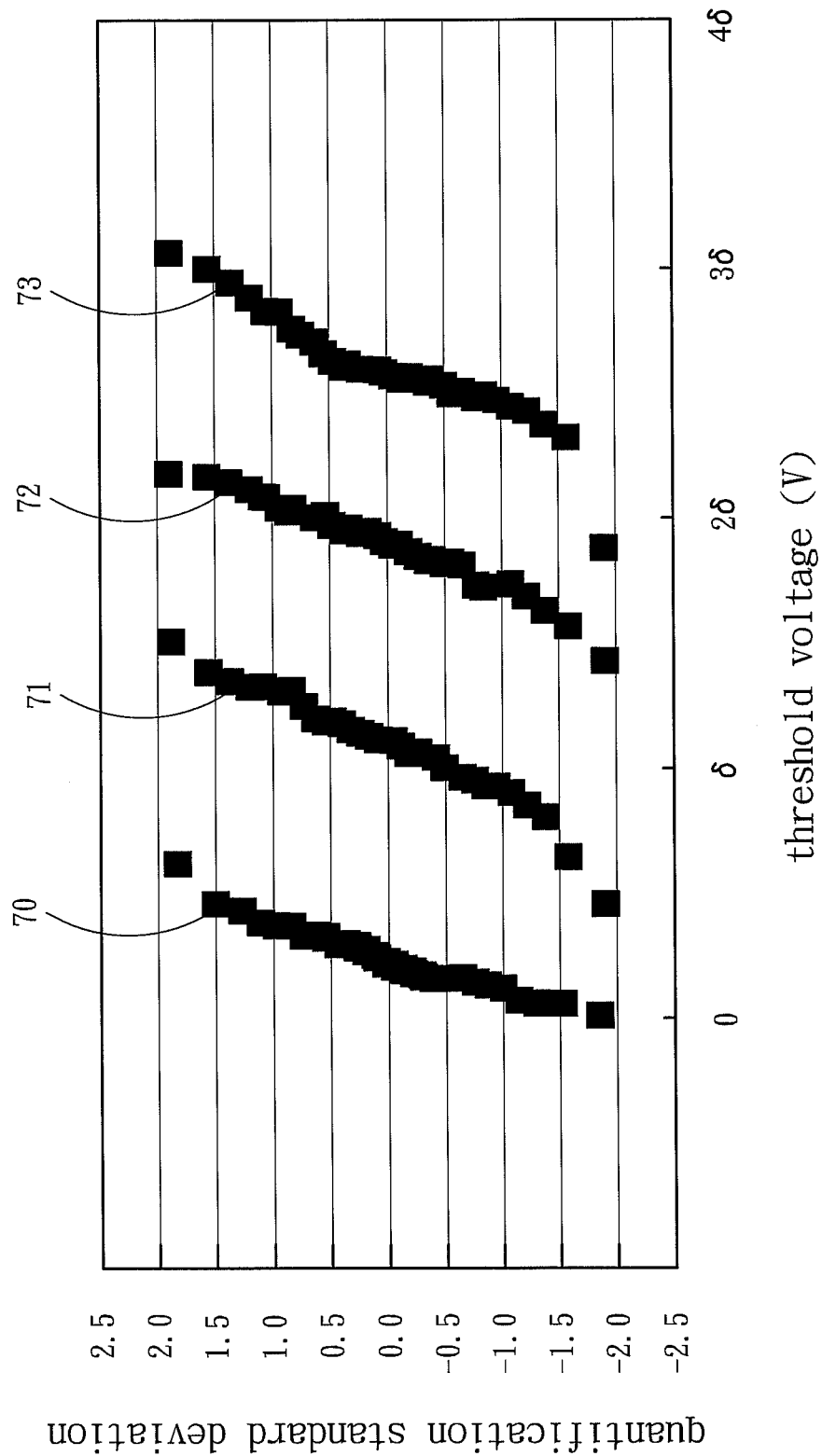
FIG. 4 is a chart of an embodiment of the invention showing quantification standard deviation.

Referring to FIG. 4, the cut-off voltage Voff of the first cut-off voltage curve 71 is −1V, the cut-off voltage Voff of the second cut-off voltage curve 72 is −2V, and the cut-off voltage Voff of the third cut-off voltage curve 73 is −3V. Compared with a reference curve 70, the threshold voltage of the third cut-off voltage curve 73 is significantly higher than the other two, it represents that the turn-on voltage Von and cut-off voltage Voff which are opposite numbers can effectively prevent the problem of one side conduction because there is only one gate 60 at one side of the pillar 30 has the turn-on voltage Von. Moreover, the greater the voltage difference between the cut-off voltage Voff and turn-on voltage Von, the greater the threshold voltage, thus the ON and OFF states of the pillar 30 also are more significant, and can meet use requirements. In FIG. 4, symbols 0, δ, 2δ, 3δ, and 4δ (volt) are marked on the X-coordinate to indicate increased multiples to serve as the value level of the coordinates.

As a conclusion, whether electric connection takes places between the source and drain at two ends of the pillar 30 is controlled via the two gates 60 at two sides of the pillar 30, hence there is no need to cut and separate the gates 60 in the trenches 31, and the etching process can be exempt from the procedure of manufacturing at a smaller feature size, thus the problem of difficult to separate the gates 60 can be solved. Moreover, by controlling the gate 60 to have the clearing voltage Vtran in the clearing state, the problem of current leakage during transition from the short circuit state to the false broken circuit state can be prevented. Thus data reading/writing accuracy improves. In addition, by controlling the clearing voltage Vtran to be the average value of the turn-on voltage Von and cut-off voltage Voff, state transition is faster. All these show that the invention provides significant improvements over the conventional techniques.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method of controlling a vertical dual-gate dynamic random access memory which includes a bit line formed on a surface of a substrate, a plurality of pillars located on the bit line and spaced from each other, a plurality of trenches each of which being formed between any two of the plurality of pillars, a dielectric layer formed on a surface of the trench and a plurality of gates located in the trenches and spaced from the pillars by the dielectric layer, the pillars including a first pillar and a second pillar, the method comprising:

providing a short circuit state to control a first gate and a second gate which are located at two sides of the first pillar to respectively have a turn-on voltage to form electric connection between a drain and a source at two ends of the first pillar;

providing a clearing state to control the first gate and the second gate to respectively have a clearing voltage to disconnect the electric connection between the drain and the source at the two ends of the first pillar, the clearing voltage having an absolute value smaller than that of the turn-on voltage; and providing a false broken circuit state to control the second gate and a third gate which are located at two sides of the second pillar to respectively have a turn-on voltage while the first gate is controlled to have a cut-off voltage so that a false broken circuit is formed between the drain and the source at the two ends of the first pillar, and electric connection is formed between a source and a drain at two ends of the second pillar.

2. The method of claim 1, wherein the turn-on voltage and the cut-off voltage are respectively a positive voltage and a negative voltage, the first pillar and the second pillar being N-type transistors.

3. The method of claim 2, wherein the turn-on voltage and the cut-off voltage are opposite numbers.

4. The method of claim 2, wherein the clearing voltage is an average value of the turn-on voltage and the cut-off voltage.

5. The method of claim 2, wherein the clearing voltage is equal to the cut-off voltage.

6. The method of claim 1, wherein the turn-on voltage and the cut-off voltage are respectively a negative voltage and a positive voltage, the first pillar and the second pillar being P-type transistors.

7. The method of claim 6, wherein the turn-on voltage and the cut-off voltage are opposite numbers.

8. The method of claim 6, wherein the clearing voltage is an average value of the turn-on voltage and the cut-off voltage.

9. The method of claim 6, wherein the clearing voltage is equal to the cut-off voltage.

10. The method of claim 1 further including a full broken circuit state to control the first gate and the second gate to respectively have a cut-off voltage to fully disconnect the electric connection between the source and the drain at the two ends of the first pillar.

11. The method of claim 1, wherein the bit line is formed on the surface of the substrate via ion implantation.

12. The method of claim 1, wherein each pillar includes one end remote from the substrate to couple with a capacitor.

* * * * *